US012607866B2

(12) United States Patent
Huang et al.

(10) Patent No.: US 12,607,866 B2
(45) Date of Patent: Apr. 21, 2026

(54) DISPLAY DEVICE

(71) Applicant: AUO Corporation, Hsin-Chu (TW)

(72) Inventors: Yu-Hsin Huang, Hsin-Chu (TW);
Chia-An Lee, Hsin-Chu (TW);
Yi-Hong Chen, Hsin-Chu (TW);
Kuan-Heng Lin, Hsin-Chu (TW)

(73) Assignee: AUO CORPORATION, Hsin-Chu
(TW)

( * ) Notice: Subject to any disclaimer, the term of this
patent is extended or adjusted under 35
U.S.C. 154(b) by 547 days.

(21) Appl. No.: 17/989,662

(22) Filed: Nov. 17, 2022

(65) Prior Publication Data

US 2023/0229012 A1 Jul. 20, 2023

(30) Foreign Application Priority Data

Jan. 18, 2022 (TW) .................................. 111102079

(51) Int. Cl.
*G02B 1/00* (2006.01)
*G02B 27/09* (2006.01)
*H10H 20/855* (2025.01)

(52) U.S. Cl.
CPC ......... *G02B 27/0938* (2013.01); *G02B 1/002*
(2013.01); *G02B 27/0922* (2013.01); *H10H
20/855* (2025.01)

(58) Field of Classification Search
CPC ................................................ G02F 1/133606
See application file for complete search history.

(56) References Cited

U.S. PATENT DOCUMENTS

| | | | |
|---|---|---|---|
| 10,896,994 B1 | 1/2021 | Shipton et al. | |
| 2015/0219806 A1 | 8/2015 | Arbabi et al. | |
| 2017/0287151 A1 | 10/2017 | Han et al. | |
| 2021/0263329 A1 | 8/2021 | Latawiec | |
| 2022/0091428 A1* | 3/2022 | Riley, Jr. ................ | G02B 27/09 |

FOREIGN PATENT DOCUMENTS

| | | |
|---|---|---|
| CN | 103293684 A | 9/2013 |
| CN | 108061936 A | 5/2018 |
| CN | 110488317 A | 11/2019 |
| CN | 110531528 A | 12/2019 |
| CN | 108988123 B | 5/2020 |
| CN | 111158076 A | 5/2020 |

(Continued)

OTHER PUBLICATIONS

CNIPA has issued the Office Action for the corresponding China
application on Oct. 17, 2023.

(Continued)

*Primary Examiner* — Joseph P Martinez
(74) *Attorney, Agent, or Firm* — WPAT, PC

(57) ABSTRACT

A display device includes: a light source having a light
emitting surface configured to emit light, a light transmitting
layer covering the light source and having a light exit surface
configured to receive the light emitted from the light emit-
ting surface, a first metasurface formed between the light
emitting surface and the light transmitting layer and config-
ured to concentrate the light emitted by the light source in a
first direction along the light emitting surface, and a second
metasurface formed on the light exit surface and configured
to split the light received by the light exit surface in the first
direction.

18 Claims, 13 Drawing Sheets

(56)     References Cited

FOREIGN PATENT DOCUMENTS

| | | | |
|---|---|---|---|
| CN | 111656707 | A | 9/2020 |
| CN | 111936818 | A | 11/2020 |
| TW | 201842367 | A | 12/2018 |

OTHER PUBLICATIONS

German Patent Office has issued the Office Action for the corresponding German application on Mar. 13, 2024.
CNIPA has issued the Office Action for the corresponding China application on Apr. 25, 2023.

* cited by examiner

10

P

DISPLAY DEVICE

CROSS-REFERENCE TO RELATED APPLICATION

This application claims the priority benefit of Taiwan Application No. 111102079, filed on Jan. 18, 2022. The entirety of each of the above-mentioned patent applications is hereby incorporated by reference herein and made a part of this specification.

BACKGROUND OF THE INVENTION

1. Field of the Invention

The present invention relates to a display device. Specifically, the present invention relates to a display device with two metasurfaces provided on the light exit path.

2. Description of the Prior Art

With the popularization and development of display devices, the demand for display devices that can be applied to display at different viewing angles is also increasing. However, light sources provided in the display devices generally either have a limited light-emitting angle or an excessively wide light-emitting angle. As the elements inside the display devices and the corresponding sub-pixels become miniaturized, in fact, it is difficult to design and adjust the light sources separately for displaying at different viewing angles. In addition, when the display is performed with a wide light exit angle in order to display at different viewing angles, unnecessary light loss or light interference might be occurred at unexpected viewing angles. Therefore, in order to overcome the aforementioned problems and difficulties, it is necessary to design a structure other than the light source that can adjust and concentrate the light at the expected viewing angle.

SUMMARY OF THE INVENTION

In order to solve the aforementioned problem, the present invention provides a display device, which includes: a light source having a light emitting surface configured to emit light, a light transmitting layer covering the light source and having a light exit surface, the light exit surface configured to receive the light emitted from the light emitting surface, a first metasurface formed between the light emitting surface and the light transmitting layer and configured to concentrate the light emitted from the light source along a first direction of the light emitting surface, and a second metasurface formed on the light exit surface and configured to split the light received by the light exit surface in the first direction.

The display device provided according to embodiments of the present invention may output light toward different predetermined viewing angles at the same time and decrease the light output at unessential viewing angles, so as to achieve the multi-viewing angle display at decreased light loss. Therefore, the display device provided according to each embodiment of the present invention can be applied to occasions or situations with different predetermined display viewing angles and can improve the overall luminous efficiency. In addition, possible interferences of the direct light or indirect reflected light at the unessential angle can be decreased or avoided.

DETAILED DESCRIPTION OF THE PREFERRED EMBODIMENT

Various embodiments will be described below, and those skilled can easily understand spirits and principles of the present invention through the description with reference to drawings. However, although some specific embodiments are described in detail herein, these embodiments are intended to be illustrative only and are not to be considered in a limiting or exhaustive sense in all respects. Therefore, for those skilled in the art, various changes and modifications of the present invention should be obvious and easily accomplished without departing from the spirits and principles of the present invention.

Figure 1:
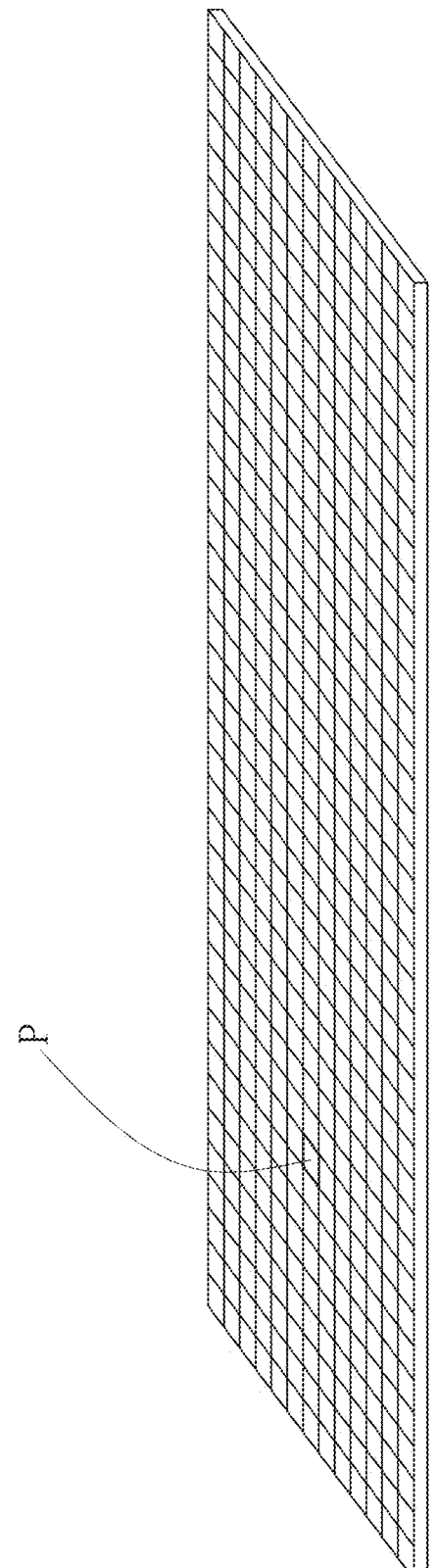
FIG. 1 is a diagram of a display device according to an embodiment of the present invention.
Figure 2:
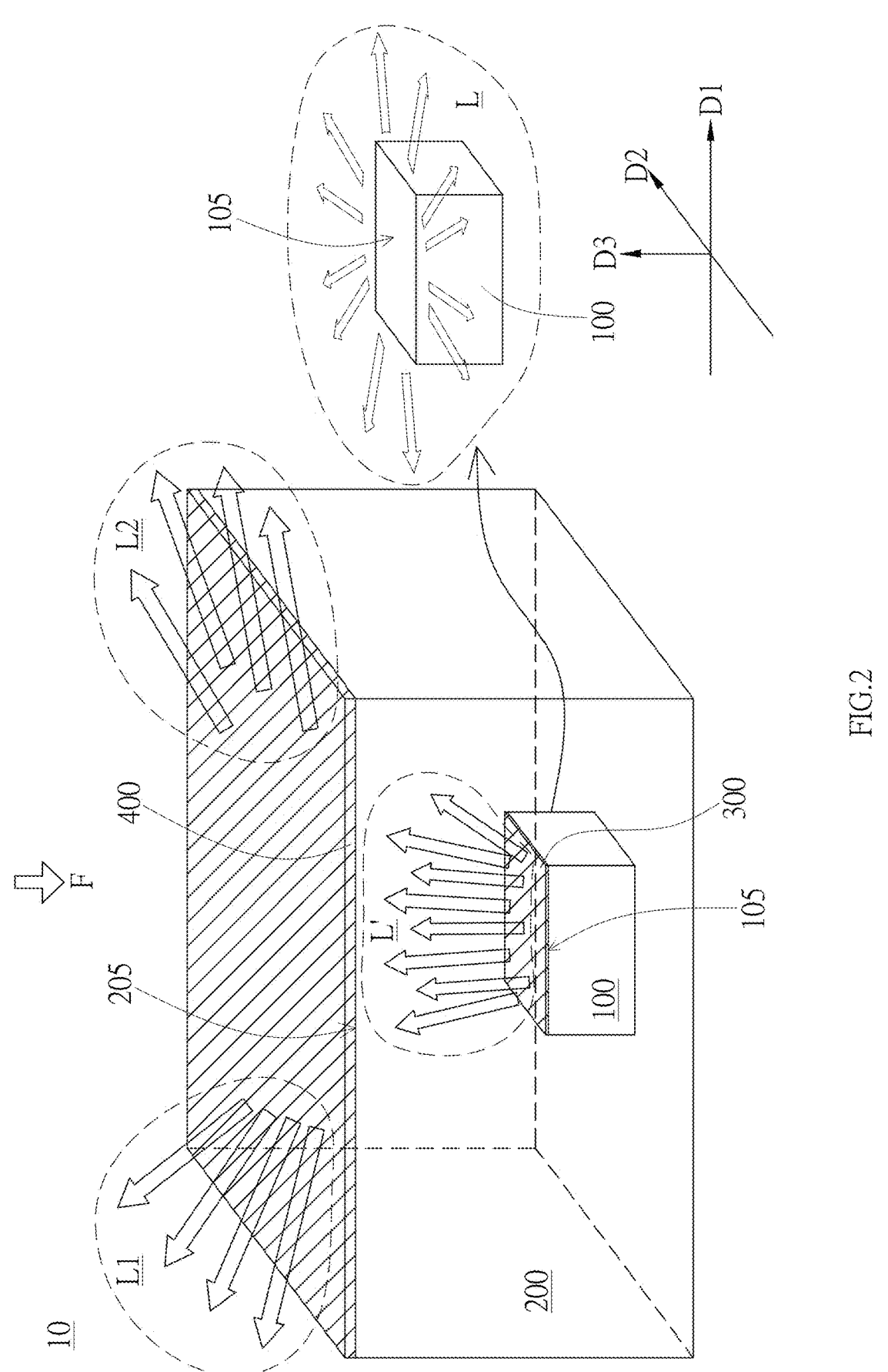
FIG. 2 is a schematic diagram of the light output of the display device according to an embodiment of the present invention.

Referring to FIG. 1 and FIG. 2, according to an embodiment of the present invention, the display device 10 can be provided with double metasurfaces in a light exit path of a light source 100. For example, as illustrated in FIG. 1, the display device 10 can be configured with a plurality of sub-pixels P. For example, the display device 10 may have a plurality of sub-pixels P, which can display light of different colors, such as red, green, or blue, respectively. In the display device 10, a plurality of light sources 100 may be respectively and correspondingly included in the plurality of sub-pixels P to emit light. Hereinafter, the arrangement or configuration of a single light source 100 will be described mainly with reference to FIG. 2.

Please refer to FIG. 2. The display device 10 according to the present invention can include: a light source 100 having a light emitting surface 105 configured to emit light L, a light transmitting layer 200 covering the light source 100 and having a light exit surface 205, a first metasurface 300 formed between the light emitting surface 105 and the light transmitting layer 200, and a second metasurface 400 formed on the light exit surface 205.

According to some embodiments, the aforementioned light source 100 can be a light source with a single light emitting surface (e.g. the light emitting surface 105) to emit light, or can be a light source with multiple light emitting surfaces (e.g. the light emitting surface 105 and other light emitting surface(s)) to emit light. For example, in some embodiments, the light source 100 can be a micro light-emitting diode (Micro LED, pLED) with a plurality of surfaces each configured to emit light at a wide angle, but not limited thereto. In addition to the micro LED (pLED), various other light sources can be applied according to other embodiments.

The light transmitting layer 200 which covers the light source 100 may separately cover the light source 100, or may be at least partially and directly in contact with the light source 100 to cover the light source 100. Furthermore, according to some embodiments, the entire light source 100 may be covered in the light transmitting layer 200, but not limited thereto.

According to some embodiments, the aforementioned light transmitting layer 200 may be made of any suitable materials that has the light transmitting property and allows predetermined light (i.e., light emitted from the light source 100) to pass therethrough. For example, the material of the light transmitting layer 200 can be polycarbonate (PC), poly(methyl methacrylate) (PMMA), Acrylonitrile-Butadiene-Styrene (ABS), and the like, but not limited thereto. In addition, according to some embodiments, the light transmitting layer 200 may function as a protection layer (over coat) to protect the light source 100.

The light exit surface 205 of the light transmitting layer 200 may be provided opposite to the light emitting surface 105 of the light source 100 and may receive the light emitted from the light emitting surface 105 of the light source 100. For example, the light emitting surface 105 of the light source 100 and the light exit surface 205 of the light transmitting layer 200 may be the top surface of the light source 100 and the top surface of the light transmitting layer 200, respectively.

Hereinafter, the structure configuration for adjusting the light output of the single light emitting surface 105 of the light source 100 are mainly described.

Specifically, the first metasurface 300 provided between the light emitting surface 105 and the light transmitting layer 200 can be configured to concentrate the light toward the center along a first direction D1 of the light emitting surface 105 (e.g. the first direction D1 parallel to the light emitting surface 105). The second metasurface 400 can be configured to split the light L', which is received by the light exit surface 205 in the first direction D1, relative to the center.

In detail, as illustrated in the right portion of FIG. 2, when no metasurfaces is provided, the light L emitted from the light emitting surface 105 of the light source 100 may have a wide angle light field pattern and be emitted in all directions. As such, the light emitted at the wide angle may cause unnecessary light loss and is not conducive to display for specific viewing angles. Therefore, as illustrated in the left portion of FIG. 2, in the structure according to the present embodiment, the wide angle light L originated from the light source 100, after passing through the first metasurface 300, can be concentrated toward the center at least in the first direction D1 as the light L', which is relatively concentrated and has a converged light field pattern.

According to some embodiments, for example, in order to incorporate with the manufacturing process or other functional layers of the light source 100, the first metasurface 300 can be provided apart from the light emitting surface 105 and held between the light emitting surface 105 and the light transmitting layer 200. However, in order to enhance the utilization of light, the first metasurface 300 can be disposed between the light emitting surface 105 and the light transmitting layer 200 by directly forming the first metasurface 300 on the light emitting surface 105.

In addition, the first metasurface 300 can be configured to concentrate the light toward the center in a second direction D2, which is parallel to the light emitting surface 105 and perpendicular to the first direction D1. Accordingly, compared with the light L originated from the light emitting surface 105 of the light source 100, the light L' can have a light field pattern, which is more concentrated in the first direction D1 and further in the second direction D2, so as to be focused on a positive direction of the light emitting surface 105.

Then, the aforementioned light L' is emitted through the light transmitting layer 200 to the light exit surface 205 of the light transmitting layer 200 and received by the light exit surface 205. The light L' received by the light exit surface 205 is then emitted from the second metasurface 400, which is provided on the light exit surface 205. After passing through the second metasurface 400, the light L' can be substantially divided relative to the center into light L1 and light L2 in the first direction D1, so as to be emitted toward different viewing angles.

According to some embodiments, for example, in order to incorporate with the manufacturing process or other functional layers of the light transmitting layer 200, the second metasurface 400 can be provided apart from the light exit surface 205 over the light exit surface 205. However, in order to enhance the utilization of light, the second metasurface 400 can be provided on the light exit surface 205 by directly forming the second metasurface 400 on the light exit surface 205.

In addition, similar to the first metasurface 300, the second metasurface 400 can be configured to concentrate the light in the second direction D2. Alternately, according to some embodiments, the second metasurface 400 may not specifically concentrate or disperse light in the second direction D2.

As mentioned above, the first metasurface 300 may be formed between the second metasurface 400 and the light emitting surface 105 of the light source 100; accordingly, the light emitted from the light source 100 can sequentially pass through the first metasurface 300 and the second metasurface 400. As such, the light emitted from the light source 100 can be firstly concentrated and converged, and then be split in the predetermined direction, such as the first direction D1, and emitted toward different viewing angles.

Figure 3A:
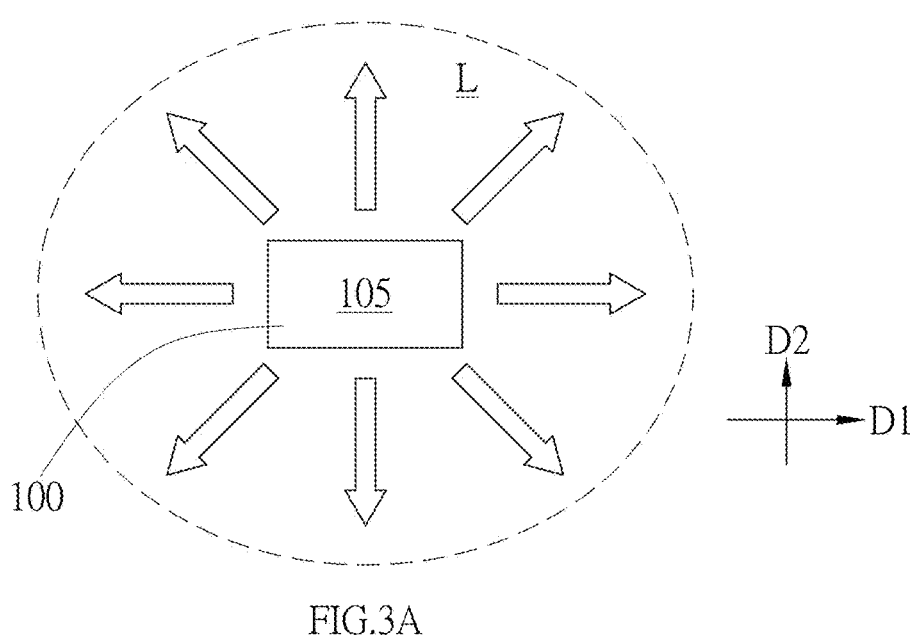
FIGS. 3A to 3C are schematic diagrams of the light output of the display device at different stages according to an embodiment of the present invention.
Figure 3B:
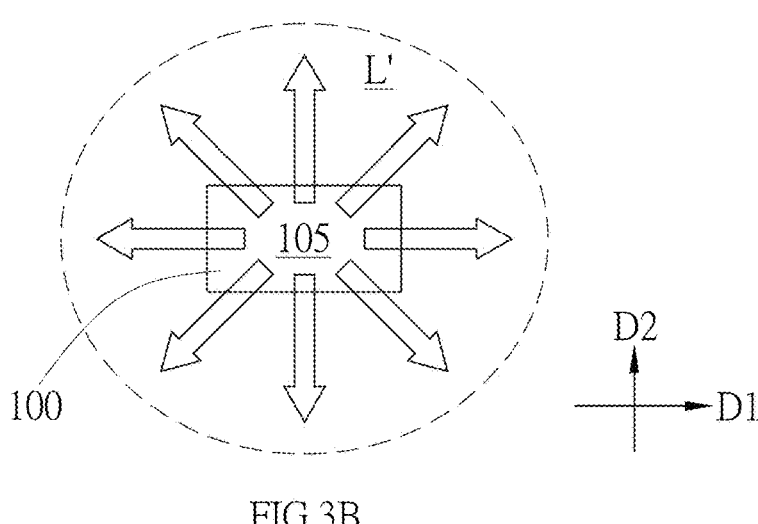
Figure 3C:
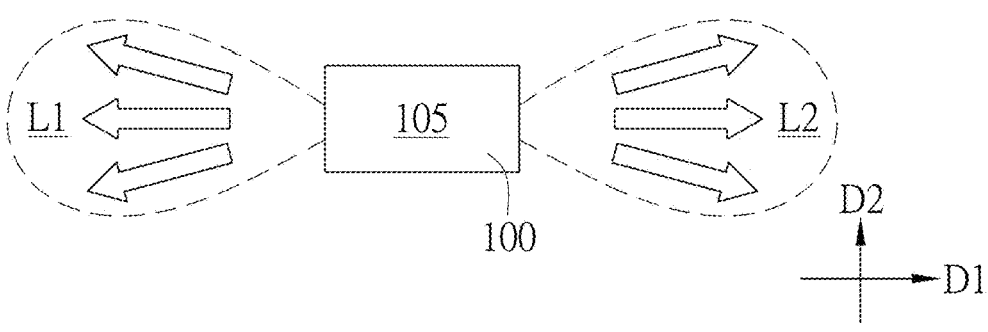

The aforementioned process of emitting light from the light source 100 and sequentially passing through the first metasurface 300 and the second metasurface 400 can be referred to FIGS. 3A to 3C. Specifically, FIGS. 3A to 3C illustrate the degree of divergence of the emitted light relative to the light emitting surface 105 of the light source 100 when the display device 10 is viewed from above along the observe direction F of FIG. 2. FIG. 3A illustrates the light L directly emitted from the light source 100, which is divergently distributed. FIG. 3B illustrates the light L' passing through the first metasurface 300 after being emitted from the light source 100, which is more concentrated and converged in the first direction D1 and the second direction D2 compared with the light L. FIG. 3C illustrates the light L1 and L2 passing through the first metasurface 300 and the second metasurface 400 after being emitted from the light source 100, wherein the light L1 and L2 are split in the first direction D1 compared with the light L'.

As mentioned above, the display device 10 according to the present embodiment is provided with the first metasurface 300 configured to concentrate the light and the second metasurface 400 configured to split the light into the light L1 and L2 in the first direction D1, and the light L1 and L2 are emitted toward different predetermined viewing angles, respectively. Therefore, the display device 10 according to the present embodiment may be configured to display toward different predetermined viewing angles, or may be applied to any occasions or situations where the display device 10 needs to be correspondingly and separately viewed from different predetermined viewing angles. For example, it can be applied to the situations where the display device 10 needs to be viewed from different viewing angles or can be applied to 3D display and the like.

The arrangement of the first metasurface 300 and the second metasurface 400 according to another embodiment will be further described.

Figure 4:
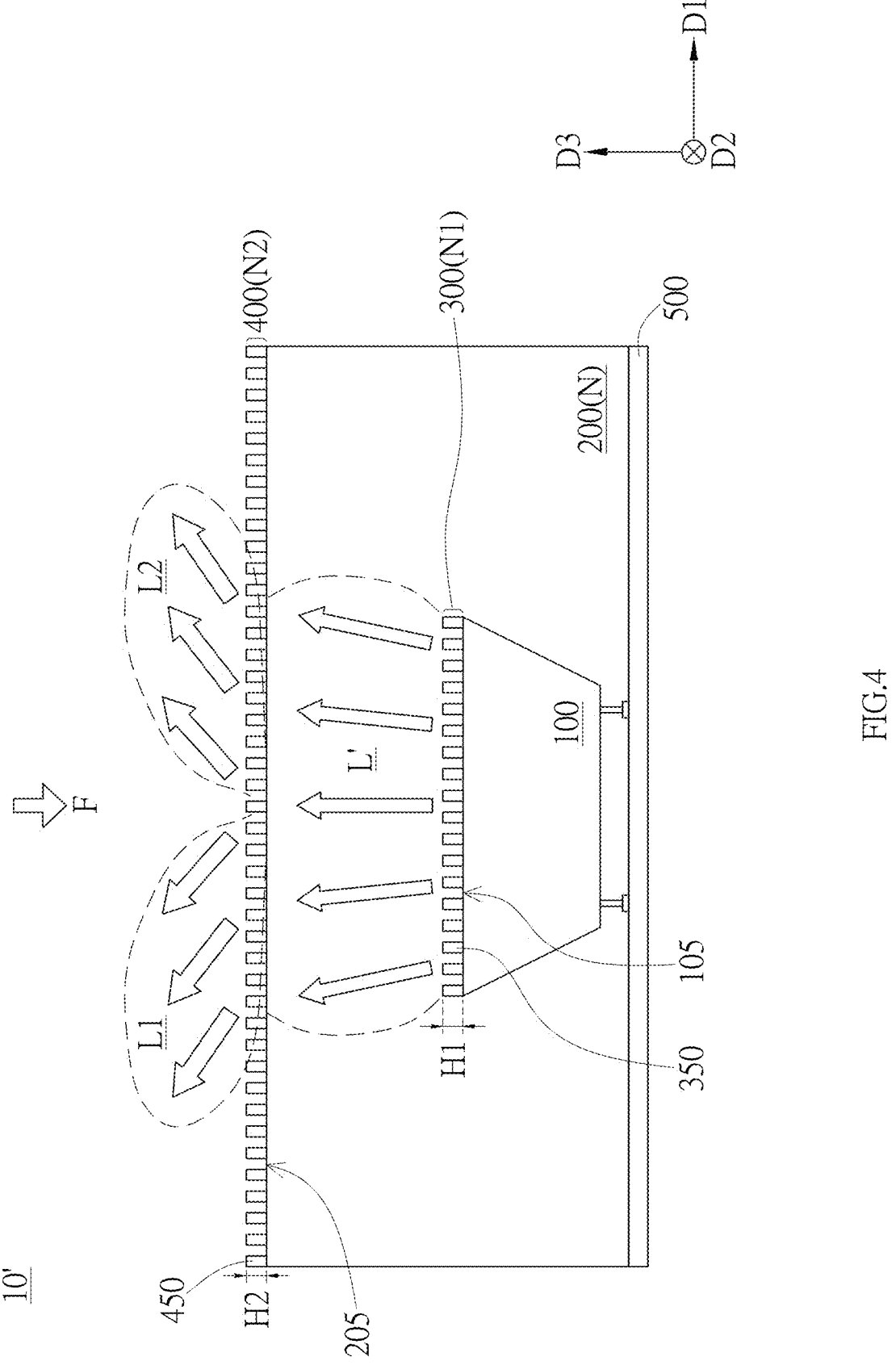
FIG. 4 is a schematic diagram of the arrangement of a first metasurface and a second metasurface of the display device according to an embodiment of the present invention.

Please refer to FIG. 4. The display device 10' according to an embodiment of the present invention may have the first metasurface 300 and the second metasurface 400 same as or similar to those of the aforementioned display device 10. As such, the display effect of concentrating the output light toward different predetermined viewing angles can be realized by concentrating the light with the first metasurface 300 and then splitting the light with the second metasurface 400. According to the configuration of the present embodiment, the first metasurface 300 of the display device 10' may have a plurality of first microstructures 350, and the second metasurface 400 of the display device 10' may have a plurality of second microstructures 450.

According to some embodiments, materials for forming the first metasurface 300 or the second metasurface 400 may be the same or different metal materials or dielectric materials having high refractive indexes. The refractive index N1 or N2 of the dielectric materials for forming the first metasurface 300 or the second metasurface 400 may be larger than the refractive index N of the light transmitting layer 200. For example, the refractive index N1 or N2 of the dielectric materials for forming the plurality of first microstructures 350 and the plurality of second microstructures 450 may be larger than the refractive index N of the light transmitting layer 200, respectively. The first microstructures 350 and the second microstructures 450 can be formed by the same or different metal materials or dielectric materials and can be arranged in suitable pattern in accordance with the predetermined purposes of concentrating or splitting the light.

The first microstructures 350 and the second microstructures 450 may be microstructures of subwavelength scale and can modulate the properties of the light, such as the light exit angle, when arranged in specific patterns. The aforementioned subwavelength scale refers that the size and the arrangement period of the first microstructures 350 and the second microstructures 450 can be smaller than the wavelength of the light, which is expected to pass therethrough.

Therefore, the influence on the properties of light can be determined based on the properties of the metasurface material such as refractive index and the arrangement (or configuration) thereof. For example, the optical diffraction effects generated by the arrangement (or configuration) of the first metasurface 300 can concentrate the light passing therethrough, and the optical diffraction effects generated by the arrangement (or configuration) of the second metasurface 400 can split the light passing therethrough.

In general, the refractive index N of the light transmitting layer 200 can be larger than the refractive index of the air. Furthermore, according to some embodiments, the refractive index N of the light transmitting layer 200 may also be larger than that of the light source 100, but not limited thereto. According to some embodiments, when the refractive index N of the light transmitting layer 200 is, for example, about 1.45 to 1.5, and the first metasurface 300 or the second metasurface 400 is made of a dielectric material, the refractive index N1 or N2 of the dielectric material for forming the first metasurface 300 or the second metasurface 400 can be, for example, larger than or equal to 2.0.

In some embodiments, materials for forming the first metasurface 300 or the second metasurface 400 can be $TiO_2$, Ag, or $Ta_2O_5$. In addition, according to some embodiments, when the first metasurface 300 or the second metasurface 400 is made of the dielectric material, the refractive index of the dielectric material for forming the first metasurface 300 or the second metasurface 400 can be about 2, 2.15, or 2.5. However, the above embodiments are merely exemplarily, and the present invention is not limited thereto.

In addition, when the first metasurface 300 or the second metasurface 400 is made of the dielectric material, the refractive index N1 or N2 of the dielectric material for forming the first metasurface 300 or the second metasurface 400 can be adjusted based on the refractive index N of the light transmitting layer 200. For example, according to some embodiments, the refractive index N1 or N2 of the dielectric material for forming the first metasurface 300 or the second metasurface 400 can be larger than the refractive index N of the light transmitting layer 200 at least by 0.5 or more, so that the first metasurface 300 and/or the second metasurface 400 can be formed with dielectric material properties of high refractive index with respect to the light transmitting layer 200.

Furthermore, according to some embodiments, the heights H1 and H2 of the first microstructures 350 and the second microstructures 450 in a direction perpendicular to the light emitting surface 105 can both be smaller than 2000 nm. That is, the heights H1 and H2 of the first microstructures 350 and the second microstructures 450 along a third direction D3, which is perpendicular to the light emitting surface 105, can be smaller than 2000 nm. For example, the heights H1 and H2 of the first microstructures 350 and the second microstructures 450 in the direction perpendicular to the light emitting surface 105 can be about 500 nm, but not limited thereto.

In addition, in some embodiments, in order to adjust the properties of the light, the first microstructures 350 of the first metasurface 300 or the second microstructures 450 of the second metasurface 400 may have different heights, so as to increase the variety of designing the arrangement patterns or to adjust the degree of concentrating or splitting light. However, for the convenience of designing and performing the manufacture process, the first microstructures 350 of the first metasurface 300 or the second microstructures 450 of the second metasurface 400 can have the same height, and the arrangement pattern of the first metasurface

300 and the second metasurface 400 will be described below based on the same height as an example.

According to the embodiments of the present invention, in addition to the light source 100, the light transmitting layer 200, the first metasurface 300, and the second metasurface 400, the display device 10' can further have other components, which are often seen in the display devices. For example, as illustrated in FIG. 4, according to some embodiments, the display device 10' may further have components such as a circuit board 500 electrically connected to provide power to the light source 100. The circuit board 500 or the components not specifically illustrated are components often seen or optionally used in the field of the display device, which will not be further elaborated.

The arrangement of the first microstructures 350 of the first metasurface 300 according to some embodiments of the present invention will be described with reference to FIG. 5 and FIG. 6.

Figure 5:
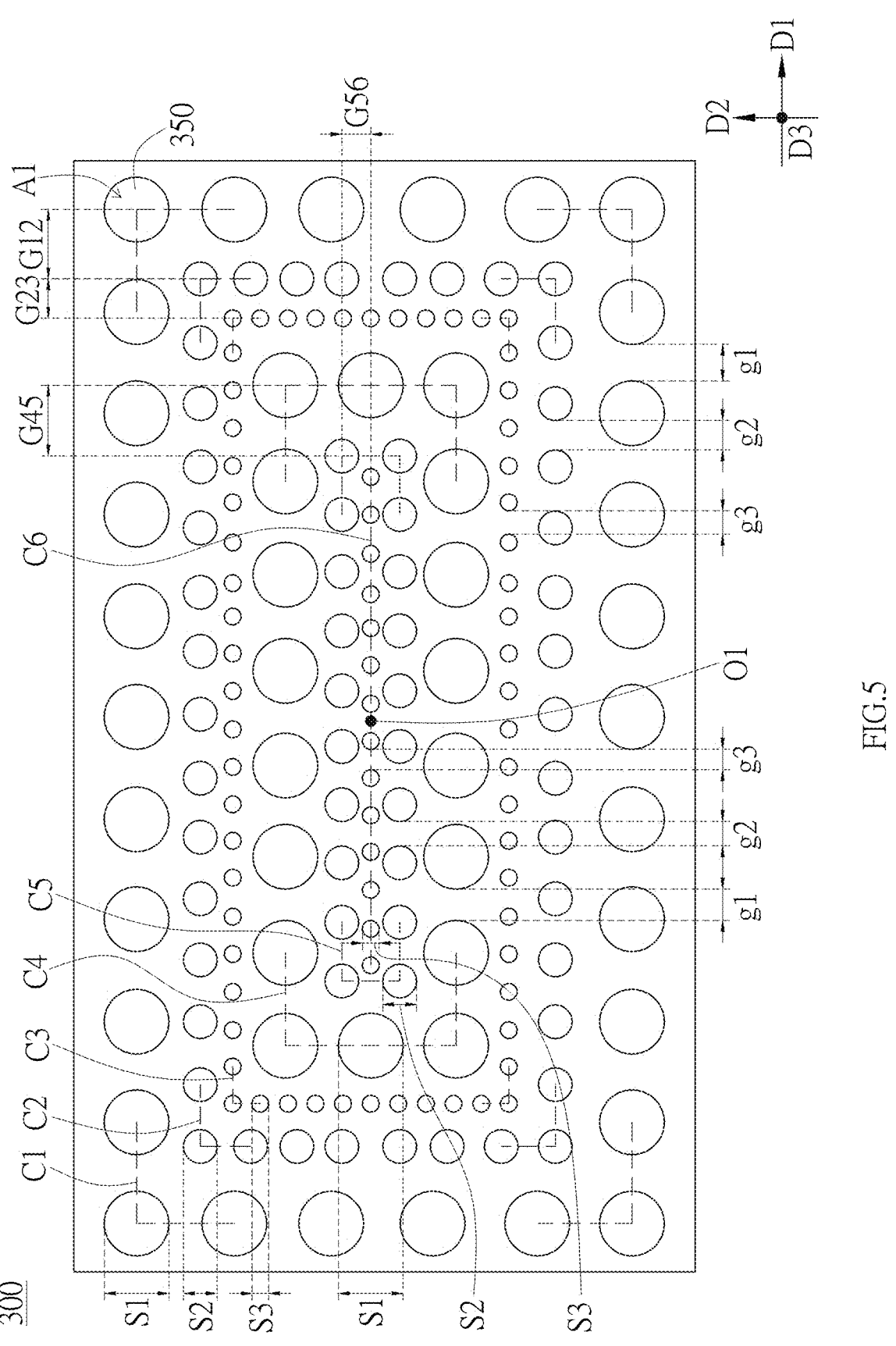
FIG. 5 is a schematic diagram of the arrangement of the first microstructures of the first metasurface according to an embodiment of the present invention.
Figure 6:
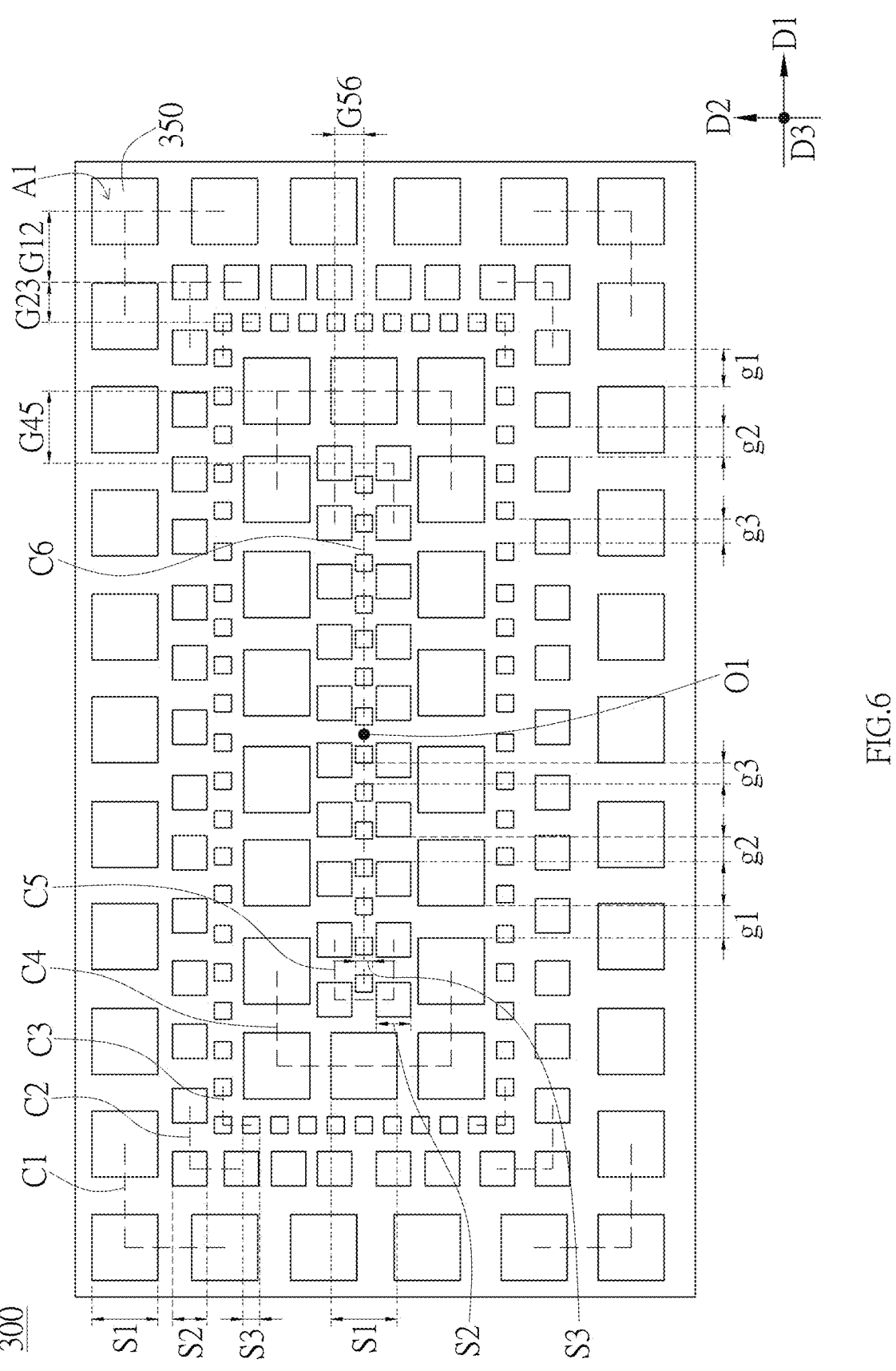
FIG. 6 is a schematic diagram of the arrangement of the first microstructures of the first metasurface according to another embodiment of the present invention.

According to some embodiments, when the first metasurface 300 is directly observed from the observe direction F of FIG. 4, the first microstructures 350 of the first metasurface 300 may be arranged, for example, as illustrated in FIG. 5 or FIG. 6. For example, the cross sections A1 of the first microstructures 350 parallel to the light emitting surface 105 can have a round shape as illustrated in FIG. 5 or a square shape as illustrated in FIG. 6, but not limited thereto. In order to concentrate the wide angle light, the cross section of the first microstructures 350 of the first metasurface 300 can have a shape without clear difference between the long axis/side and the short axis/side or can have a shape with a smeller difference between the long axis/side and the short axis/side. As such, the effects of concentrating and converging the light can be achieved evenly in all viewing angles. However, the above embodiments are merely exemplarily, and in the case of achieving the expected effect of concentrating and converging the light, according to other embodiments of the present invention, the shape of the cross section of the first microstructures 350 of the first metasurface 300 is not limited to the shapes specifically disclosed in the specification and drawings and can be varied as appropriate.

According to some embodiments, as illustrated in FIG. 5 or FIG. 6, a plurality of first microstructures 350 are circularly arranged parallel to the light emitting surface 105 to form a plurality of rings of the first microstructures 350. For example, the first metasurface 300 may have the first microstructures 350 arranged around in a first ring C1, a second ring C2, a third ring C3, a fourth ring C4, a fifth ring C5, and a sixth ring C6. However, according to some embodiments, based on the area of the first metasurface 300, the outermost or innermost first microstructures 350 can be arranged to form an incomplete ring. For example, as illustrated in FIG. 5 or FIG. 6, the first microstructures 350 of the sixth ring C6 can be substantially arranged to form a linear shape and cannot form a complete ring.

In addition, according to the present embodiment, the cross sections A1 of the plurality of first microstructures 350 of the first metasurface 300 parallel to the light emitting surface 105 may have different sizes.

For example, referring to FIG. 5 or FIG. 6, the cross sections A1 of the first microstructures 350 parallel to the light emitting surface 105 have a size change, which is gradually reduced from the outer ring to the inner ring, and the first microstructures 350 are arranged to form the plurality of rings by repeating the size change one or more times. For example, the cross section A1 of the first microstructures 350 of the first ring C1 may have a width S1; the cross section A1 of the first microstructures 350 of the second ring C2 may have a width S2; the cross section A1 of the first microstructures 350 of the third ring C3 may have a width S3. The width S1, the width S2, and the width S3 are sequentially decreased, so that the cross sections A1 of the first microstructures 350 are gradually reduced from the first ring C1 located at the outer side toward the second ring C2, the third ring C3 located at the inner side.

When the size is gradually reduced to the predetermined size from the first ring C1 at the outer side to the third ring C3 at the inner side, the size of the cross section A1 of the microstructures 350 of the next inner ring can be set to the larger size, and the size change is resumed and gradually reduced from the outer ring to the inner ring according to the present embodiment. For example, the cross section A1 of the first microstructures 350 of the fourth ring C4 may have the width S1. The cross sections A1 of the first microstructures 350 are gradually decreased from the fourth ring C4 at the outer side to the fifth ring C5, and the sixth ring C6 at the inner side. That is, the cross sections A1 of the first microstructures 350 of the fourth ring C4, the fifth ring C5, and the sixth ring C6 may respectively have the width S1, the width S2 and the width S3, which are sequentially decreased.

As mentioned above, the first microstructures 350 are arranged to form the plurality of rings by repeating the size change gradually reduced from the outer ring to the inner ring, so as to form the first metasurface 300. As such, the light passing through the first metasurface 300 can be concentrated to the inner center.

According to some embodiments, the cross sections A1 of the first microstructures 350 of the innermost ring C6 (i.e., the first microstructures 350 arranged closest to the center O1 of the first metasurface 300 and having the same size) can be the smallest. For example, the first microstructures 350 of the innermost ring C6 can have the cross section A1 with the smallest width S3.

According to some embodiments, the widths of S1, S2, S3 of the cross sections A1 of the first microstructures 350 parallel to the light emitting surface 105 can range from 20 to 2000 nm.

Furthermore, when the rings are distributed to surround one another, the distance between the cross sections A1 of the first microstructures 350 parallel to the light emitting surface 105 can have a distance change, which is gradually decreased from the outer ring C1 to the inner ring C3, and the first microstructures 350 are arranged to form the plurality of rings by repeating the distance change one or more times. For example, a gap g1 is formed between the cross sections A1 of the first microstructures 350 of the first ring C1, a gap g2 is formed between the cross sections A1 of the first microstructures 350 of the second ring C2, and a gap g3 is formed between the cross sections A1 of the first microstructures 350 of the third ring C3. The gap g1, the gap g2, the gap g3 may be sequentially decreased, so that gaps (distances) between the cross sections A1 of the first microstructures 350 are gradually decreased from the first ring C1 located at the outer side toward the second ring C2, and the third ring C3 located at the inner side. In the present embodiment, the gap is defined as the distance between edges of the adjacent first microstructures 350 within the same ring.

When the distance is decreased to the predetermined distance from the first ring C1 at the outer side to the third ring C3 at the inner side, the gap between the cross sections A1 of the microstructures 350 of the next inner ring can be set to the larger distance, and the distance change is resumed and gradually reduced from the outer ring to the inner ring according to the present embodiment. For example, in the fourth ring C4, the cross sections A1 of the first microstructures 350 may have the gap g1 therebetween, and gaps between the cross sections A1 of the first microstructures 350 are sequentially decreased from the fourth ring C4 at the outer side to the fifth ring C5, the sixth ring C6 at the inner side. That is, the cross sections A1 of the first microstructures 350 of the fourth ring C4, the fifth ring C5, and the sixth ring C6 may respectively have the gap g1, the gap g2, and the gap g3, which are sequentially decreased.

As mentioned above, the first microstructures 350 are be arranged to form the plurality of rings by repeating the distance change gradually reduced from the outer ring to the inner ring, so as to form the first metasurface 300. As such, the light passing through the first metasurface 300 can be concentrated to the inner center.

According to some embodiments, the distance between the cross sections A1 of the first microstructures 350 of the innermost ring C6 (i.e., the microstructures 350 arranged closest to the center O1 of the first metasurface 300 and having the same size) can be the smallest. For example, the gap g3 between the cross sections A1 of the first microstructures 350 of the innermost ring C6 can be the smallest.

In addition, then, according to some embodiments, in a single cycle of the size change gradually reduced from the outer ring to the inner ring, a distance change, which is gradually decreased from the outer ring to the inner ring, can be occurred between the cross sections A1 of the first microstructures 350 at the adjacent rings parallel to the light emitting surface 105. In addition, the first microstructures 350 may be arranged to form the plurality of rings in accordance with the same or similar distance change in other cycles. For example, the cross sections A1 of the first microstructures 350 of the first ring C1 and the second ring C2 may have a gap G12, the cross sections A1 of the first microstructures 350 of the second ring C2 and the third ring C3 may have a gap G23. The gap G12 and the gap G23 may be sequentially decreased, so that the cross sections A1 of the first microstructures 350 have the gradually decreased gaps from that between the first ring C1 and the second ring C2 at the outer side to that between the second ring C2 and the third ring C3 at the inner side. In the present embodiment, the gap is defined as the distance between the centers of the first microstructures 350 of the adjacent rings.

Similarly, in the next cycle of size change, a gap G45 between the fourth ring C4 and the fifth ring C5 at the relatively outer side and a gap G56 between the fifth ring C5 and the sixth ring C6 at relatively inner side may be sequentially decreased. That is, the cross sections A1 of the first microstructures 350 of the adjacent rings from the fourth ring C4 to the sixth ring C6 may have the gap G45 and the gap G56 therebetween, which are sequentially decreased.

As mentioned above, the first microstructures 350 may be arranged to form the plurality of rings by repeating the distance change gradually reduced from the outer ring to the inner ring one or more times, so as to form the first metasurface 300. As such, the light passing through the first metasurface 300 can be concentrated to the inner center.

According to some embodiments, the gap between the cross sections A1 of the first microstructures 350 of the innermost adjacent rings with different sizes can be the smallest. For example, the gap G56 between the cross sections A1 of the first microstructures 350 of the fifth ring C5 and the sixth ring C6 can be the smallest.

Gaps between the cross sections A1 of the first microstructures 350 parallel to the light emitting surface 105 (e.g.

the gaps g1, g2, and g3), or gaps between the cross sections A1 of the first microstructures 350 of the adjacent rings parallel to the light emitting surface 105 (e.g. the gaps G12, G23, G45, G56) can be smaller than 2000 nm, respectively.

Figure 7:
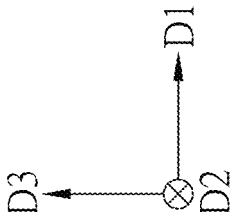
FIG. 7 is a schematic diagram of the light field pattern through the first metasurface according to an embodiment of the present invention.
Figure 7:
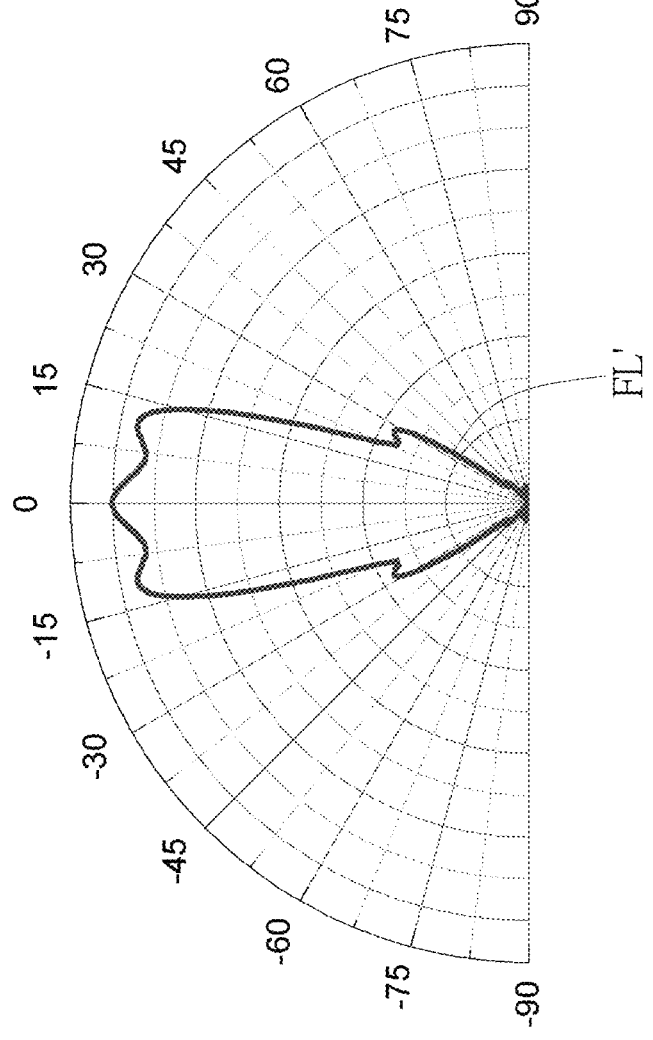

The first metasurface 300 as mentioned above can concentrate the light L emitted from the light source 100 so as to form the more concentrated light L'. For example, referring to FIG. 7, in the case that the first metasurface 300 is formed by arranging the first microstructures 350 in accordance with FIG. 5, in the cross section along the first direction D1 and the third direction D3, when the viewing angle which is perpendicular to the light emitting surface 105 along the third direction D3 is defined as 0 degree, and the included angle of an axial line relative to the third direction D3 is defined as a different viewing angle, the light passing through the first metasurface 300 can form a light field pattern FL' with concentrated light distributed approximately within plus or minus 15 degrees.

As mentioned above, the first microstructures 350 may be arranged in accordance with FIG. 5 or FIG. 6 to form the first metasurface 300 configured to concentrate the light. However, the configuration of the first metasurface 300 is not limited to thereto. Under the conditions of concentrating light, the first metasurface 300 according to other embodiments of the present invention may have other arrangements or configurations.

Next, the arrangement of the second microstructure 450 of the second metasurface 400 according to some embodiments of the present invention will be described with reference to FIG. 8 and FIG. 9.

Figure 8:
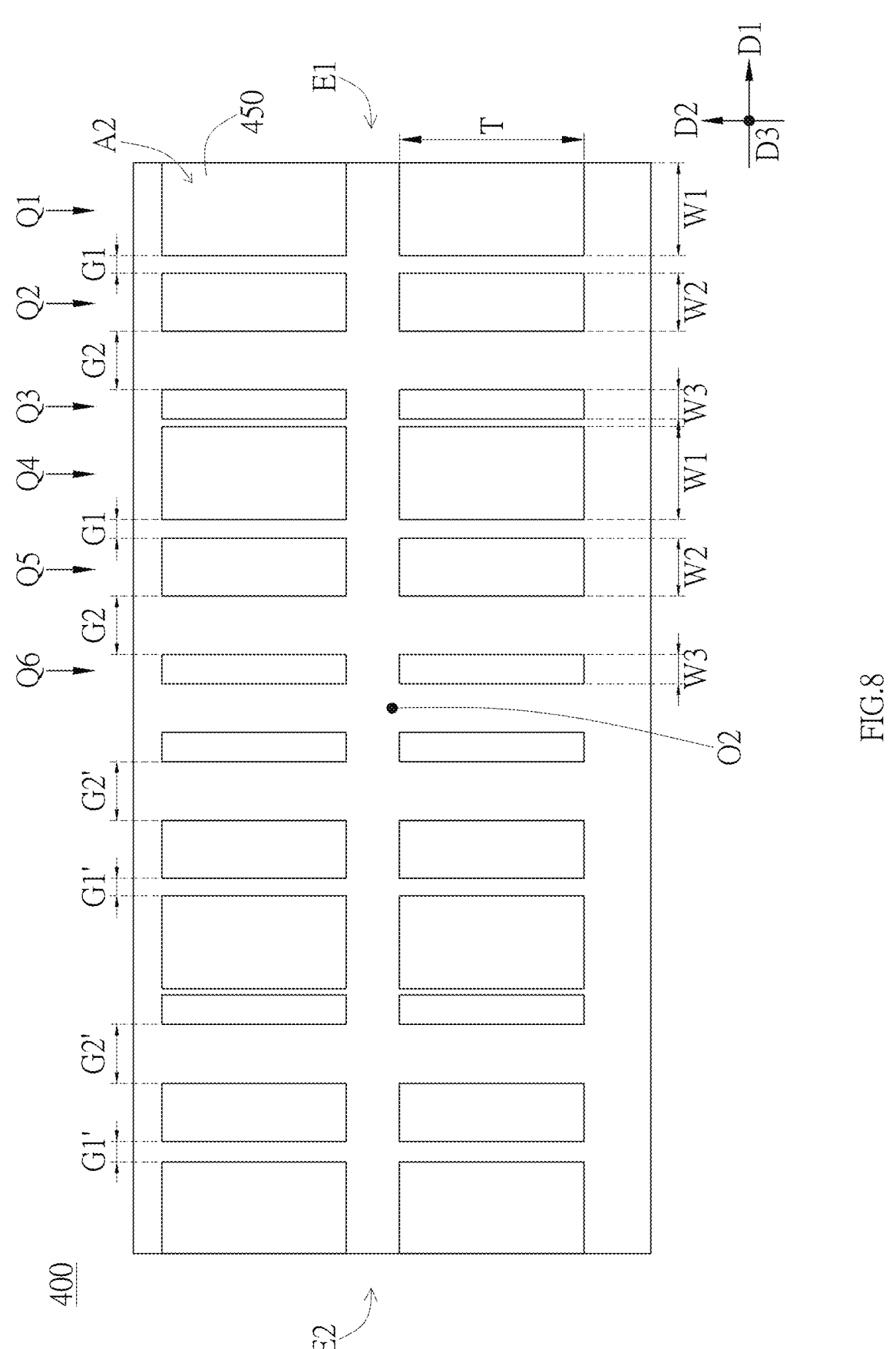
FIG. 8 is a schematic diagram of the arrangement of the second microstructures of the second metasurface according to an embodiment of the present invention.
Figure 9:
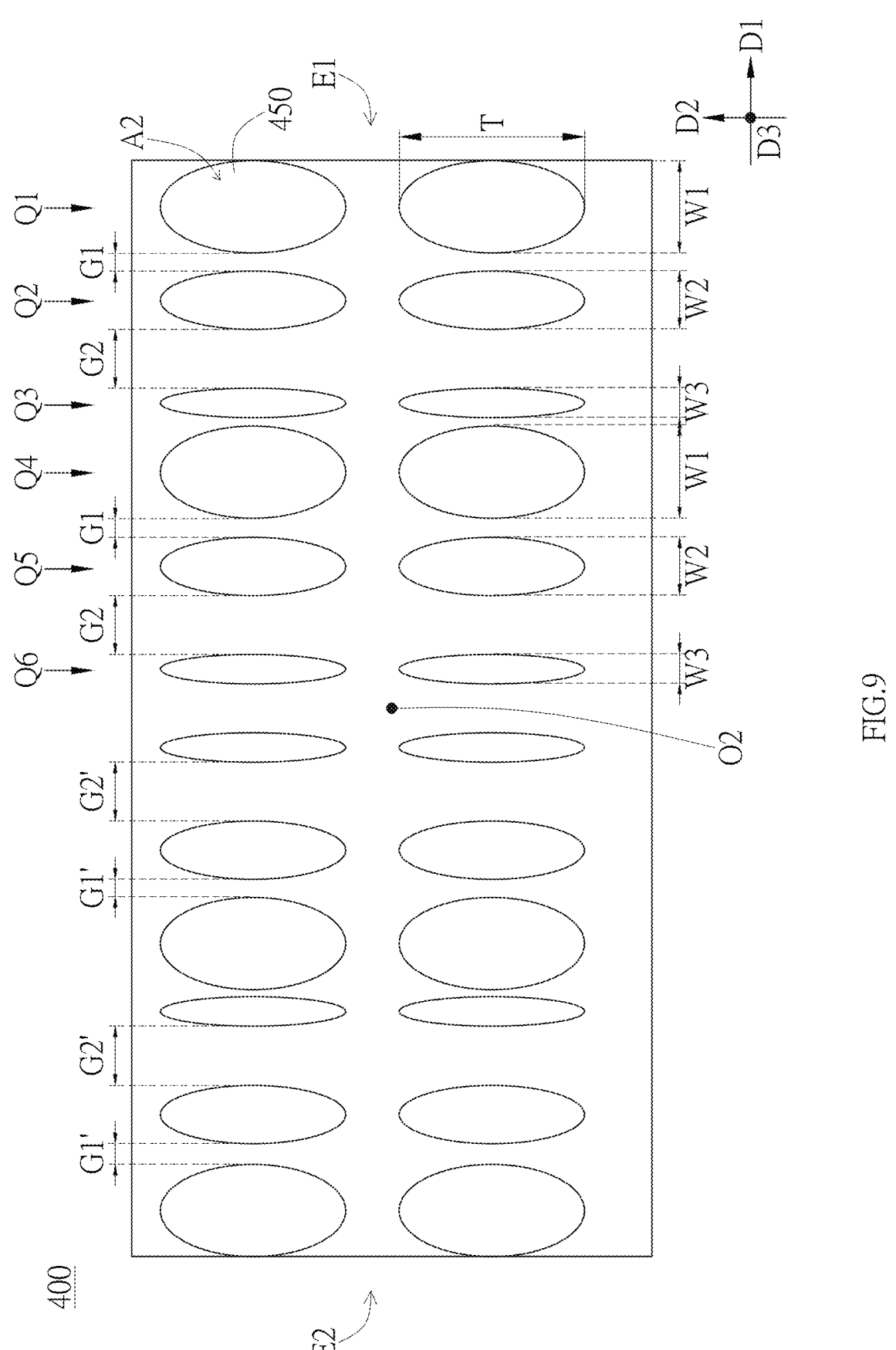
FIG. 9 is a schematic diagram of the arrangement of the second microstructures of the second metasurface according to another embodiment of the present invention.

According to some embodiments, when the second metasurface 400 is directly observed from the observe direction F of FIG. 4, the second microstructures 450 of the second metasurface 400 may be arranged, for example, as illustrated in FIG. 8 or FIG. 9. For example, the cross sections A2 of the second microstructures 450 parallel to the light emitting surface 105 can have a shape with a short axis/side along the first direction D1 and a long axis/side along the second direction D2, wherein the second direction D2 is parallel to the light emitting surface 105 and perpendicular to the first direction D1. For example, the cross sections A2 of the second microstructures 450 parallel to the light emitting surface 105 may have a rectangle shape as illustrated in FIG. 8 or an ellipse shape as illustrated in FIG. 9, but not limited thereto.

According to some embodiments, as illustrated in FIG. 8 or FIG. 9, a plurality of second microstructures 450 can be arranged along the first direction D1. For example, at least one of the second microstructure 450 can be arranged to form a row in the second direction D2, and a plurality of rows of the second microstructures 450 are arranged along the first direction D1.

The widths of the cross sections A2 of the adjacent second microstructures 450 parallel to the light emitting surface 105 in the first direction D1 can be different. For example, the cross sections A2 of the second microstructures 450 parallel to the light emitting surface 105 can have a size change, which is gradually reduced from two ends (i.e., end points E1 and E2) toward the center O2 of the second metasurface 400 along the first direction D1 and the second microstructures 450 are arranged by repeating the size change from the two ends to the center O2 one or more times.

For example, the second microstructures 450 are arranged in six rows from one end point E1 toward the center O2 along the first direction D1, which are the second microstructures 450 of a first row Q1, a second row Q2, a third row Q3, a fourth row Q4, a fifth row Q5, and a sixth row Q6, respectively. The second microstructures 450 of the first row Q1, the second row Q2, and the third row Q3, which are successively arranged along the first direction D1, can be configured to have a gradually reduced size change and have widths W1, W2, and W3 in the first direction D1, respectively. In addition, the second microstructures 450 of the fourth row Q4, the fifth row Q5, and the sixth row Q6, which are successively arranged along the first direction D1, can be configured to have a gradually reduced size change and have the widths W1, W2, and W3 in the first direction D1, respectively. The width W1 can be larger than the width W2, and the width W2 can be larger than the width W3. Similarly, the second microstructures 450 can be symmetrically arranged in six rows from the other end point E2 toward the center O2 along the first direction D1, and the arrangement thereof can be understood with reference to the above descriptions and will not be elaborated.

As mentioned above, the second microstructures 450 are arranged in a plurality of rows to form the second metasurface 400 by repeating the size change one or more times, and the size change is gradually reduced respectively from the respective end (such as the end points E1 or E2) to the center O2. As such, the light passing through the second metasurface 400 can be split to achieve the effect of concentrating the light to the predetermined viewing angles on two sides.

According to some embodiments, the widths W1, W2, and W3 of the cross sections A2 of the second microstructures 450 parallel to the light emitting surface 105 in the first direction D1 may range from 20 to 2000 nm.

According to some embodiments, the lengths T of the cross section A2 of the second microstructures 450 parallel to the light emitting surface 105 in the second direction D2 can be the same and range from 20 to 4000 nm.

According to some embodiments, the innermost second microstructures 450 closest to the center O2 may have the smallest cross section A2.

Furthermore, as mentioned above, distances between the cross sections A2 of the plurality of second microstructures 450 arranged as illustrated in FIG. 8 or FIG. 9 parallel to the light emitting surface 105 may be gradually increased from two ends (i.e., the end points E1 and E2) to the center O2 of the second metasurface 400 along the first direction D1. In addition, the second microstructures 450 are arranged by repeating such a distance change one or more times. For example, the second microstructure 450 of the first row Q1 and the second microstructure 450 of the second row Q2 may have the gap G1 therebetween, and the second microstructure 450 of the second row Q2 and the second microstructure 450 of the third row Q3 may have the gap G2 therebetween. The second microstructure 450 of the fourth row Q4 and the second microstructure 450 of the fifth row Q5 may have the gap G1 therebetween, and the second microstructure 450 of the fifth row Q5 and the second microstructure 450 of the sixth row Q6 may have the gap G2 therebetween. The gap G1 is smaller than the gap G2, so that the distances between the cross sections A2 of the plurality of second microstructures 450 parallel to the light emitting surface 105 may be gradually increased from the end point E1 toward the center O2 along the first direction D1 in a cycle of the gradually decreased size change. In the present embodiment, the gap can be defined as the distance between edges of the adjacent second microstructures 450.

Similarly, the distance change from the other end point E2 toward the center O2 can be symmetrically arranged based on the distance change from the end point E1 toward the center O2. The gap G1' can be smaller than the gap G2', so that distances between the cross sections A2 of the plurality of second microstructures 450 parallel to the light emitting surface 105 can be gradually increased from the end point E2 toward the center O2 along the first direction D1 in a cycle of the gradually decreased size change. As such, the light passing through the second metasurface 400 can be split to achieve the effect of concentrating the light at the predetermined viewing angles on two sides, and the arrangements thereof can be understood with reference to the above descriptions and will not be elaborated again.

The gaps G1, G2, G1', and G2' between the cross sections A2 of the second microstructures 450 parallel to the light emitting surface 105 may be, for example, smaller than 2000 nm, respectively.

In some embodiments, as illustrated in FIG. 8 and FIG. 9, two second microstructures 450 with the same size can be arranged along the second direction D2 with their short axes/sides adjacent to (facing) each other to form a row, but not limited thereto. In accordance with other embodiments, a single second microstructure 450 can be used as a row, or three, four, or more second microstructures 450 are arranged with their short axes/sides adjacent to each other to form a row. The number of the second microstructures 450 of the same size arranged in a row is not limited thereto.

Figure 10:
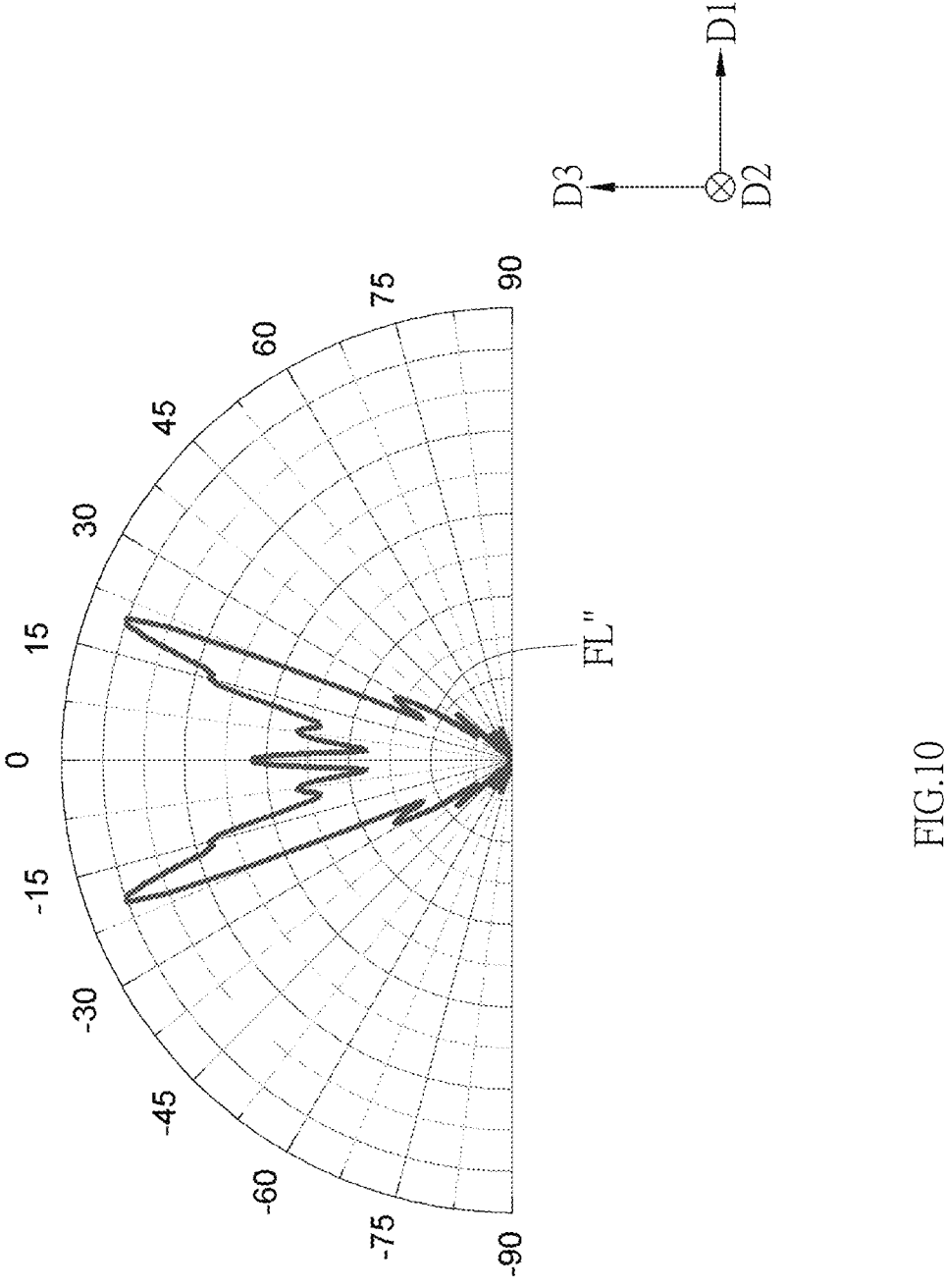
FIG. 10 is a schematic diagram of the light field pattern through the first metasurface and the second metasurface according to an embodiment of the present invention.

The second metasurface 400 as described above can split the light L', which passes through the first metasurface 300 and is concentrated, in the first direction D1 to form the light L1 and the light L2 toward different viewing angles. That is, the second metasurface 400 can split the light converged on the center into two directional patterns. For example, with reference to FIG. 10, in the case that the second microstructures 450 are arranged in accordance with FIG. 8 to form the second metasurface 400, in the cross section along the first direction D1 and the third direction D3, when the viewing angle perpendicular to the light emitting surface 105 along the third direction D3 is defined as 0 degree, and an included angel of an axial line relative to the third direction D3 is defined as a different viewing angle, the light passing through the second metasurface 400 can form a light field pattern FL" with two split lights respectively emitted toward approximately plus and minus 20 degrees and reduced light output at the viewing angle of 0 degree in the positive direction.

In the light field pattern FL", the intensity of the light emitted at the viewing angle of 0 degree in the positive direction will be smaller than the intensity of the split light respectively emitted toward the viewing angles of approximately plus and minus 20 degrees.

As mentioned above, with reference to the descriptions of FIG. 1 to FIG. 10, the display device 10 or 10' in each embodiment of the present invention can concentrate and then split the light L, which is originally emitted with the wide angle relative to the third direction D3 (e.g. angle of 0-90 degrees relative to the third direction D3), so as to emit light toward specific different viewing angles. Consequently, the light loss at the unessential angels can be decreased, and the intensity of the light at the expected different viewing angles can be enhanced, so that the display device of the present invention can be applied to the occasions or situations that require to display for different viewing angles and to reduce the light output at unessential angles.

The heights, widths, lengths, distances, gaps, refractive indexes, numbers of arrangement, times of repeating the change cycles, and the like described in the aforementioned embodiments are merely exemplarily, and can be modified in accordance with colors or other properties of the light emitted from the light source, which is expected to be concentrated or split, the expected degree of concentration, or the viewing angle of the split light. Accordingly, the heights, widths, lengths, distances, gaps, refractive indexes, numbers of arrangement, times of repeating the change cycles, and the like according to other embodiments of the present invention are not limited to the specific examples disclosed in the specification and the accompanying drawings.

In addition, according to some embodiments, the metasurface material layers can be firstly formed at locations where the metasurfaces are to be formed, and then the desired arrangement patterns or configurations corresponding to the metasurfaces can be formed by any suitable manufacturing processes. However, the present invention is not limited thereto, and the metasurfaces having the desired (expected) arrangement patterns can be formed by any processes as appropriate. For example, when the first metasurface 300 is to be formed, the metal material or the dielectric material having high refractive index on the light source 100 can be directly used to form the expected arrangement patterns. Alternately, the metasurfaces with expected arrangement patterns can be separately formed and then provided at locations where the metasurfaces is to be formed, so as to form the first metasurface 300 and/or the second metasurface 400.

Next, examples of occasions or situations where the display device according to the embodiments of the present invention is suitable or applicable will be described with reference to FIG. 11 to FIG. 13.

Figure 11:
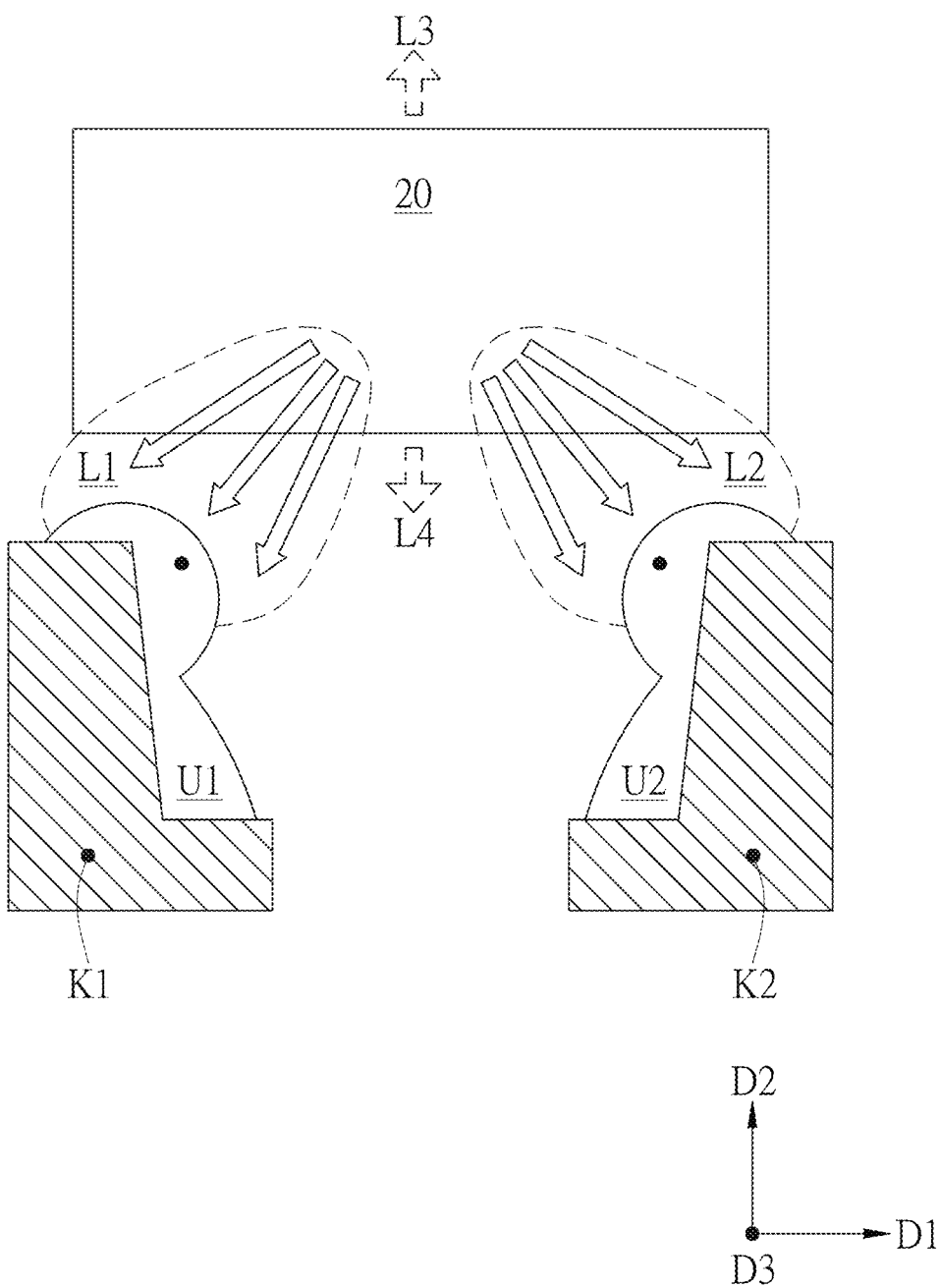
FIG. 11 is a schematic diagram of the display device applied to display for different viewing angles according to an embodiment of the present invention.

Referring to FIG. 11, according to an embodiment, a display device 20 which can be applied to display to recipients (or viewers) at different fixed positions is illustrated. The display device 20 may have the same or similar architecture with double metasurfaces as in any one of embodiments described with reference to FIG. 1 to FIG. 10. As such, the display device 20 can output light toward the expected different viewing angles so as to emit the light L1 and the light L2, which are split in the first direction D1, toward the first position K1 and the second position K2. Accordingly, when the first recipient U1 and the second recipient U2 are respectively located at the first position K1 and the second position K2, the first recipient U1 and the second recipient U2 can respectively receive the light L1 and the light L2 to view the contents displayed by the display device 20.

In such a case, in addition to the light L1 and the light L2 emitted toward the display angles of the first position K1 and the second position K2, the light emitted toward other angles can be decreased or avoided. For example, as illustrated in FIG. 11, the light L3 and the light L4 emitted in the second direction D2 can be decreased or avoided to decrease or avoid the unnecessary light loss and to improve the light output efficiency of the display device 20.

According to some embodiments, the same or similar display device as in any of the aforementioned embodiments can be used as a vehicle display. For example, referring to FIG. 12, a display device 30 can have double metasurfaces as described in any of the embodiments and is provided on a vehicle to emit the light L1 and the light L2 respectively toward the driver seat and the passenger seat for display. In such a situation, the first recipient U1 can be a driver sitting on the driver seat, and the second recipient U2 can be a passenger sitting on the passenger seat.

According to the present embodiment, the display device 30 has double metasurfaces, wherein the first metasurface is configured to concentrate the light, and the second metasurface is configured to split the concentrated light in the first direction D1. Therefore, the light output efficiency for display toward the driver seat and the passenger seat can be improved, and the light loss at the unessential angles, such as the light loss occurred at the space between the driver seat and the passenger seat, can be decreased or avoided, but not limited thereto.

Figure 12:
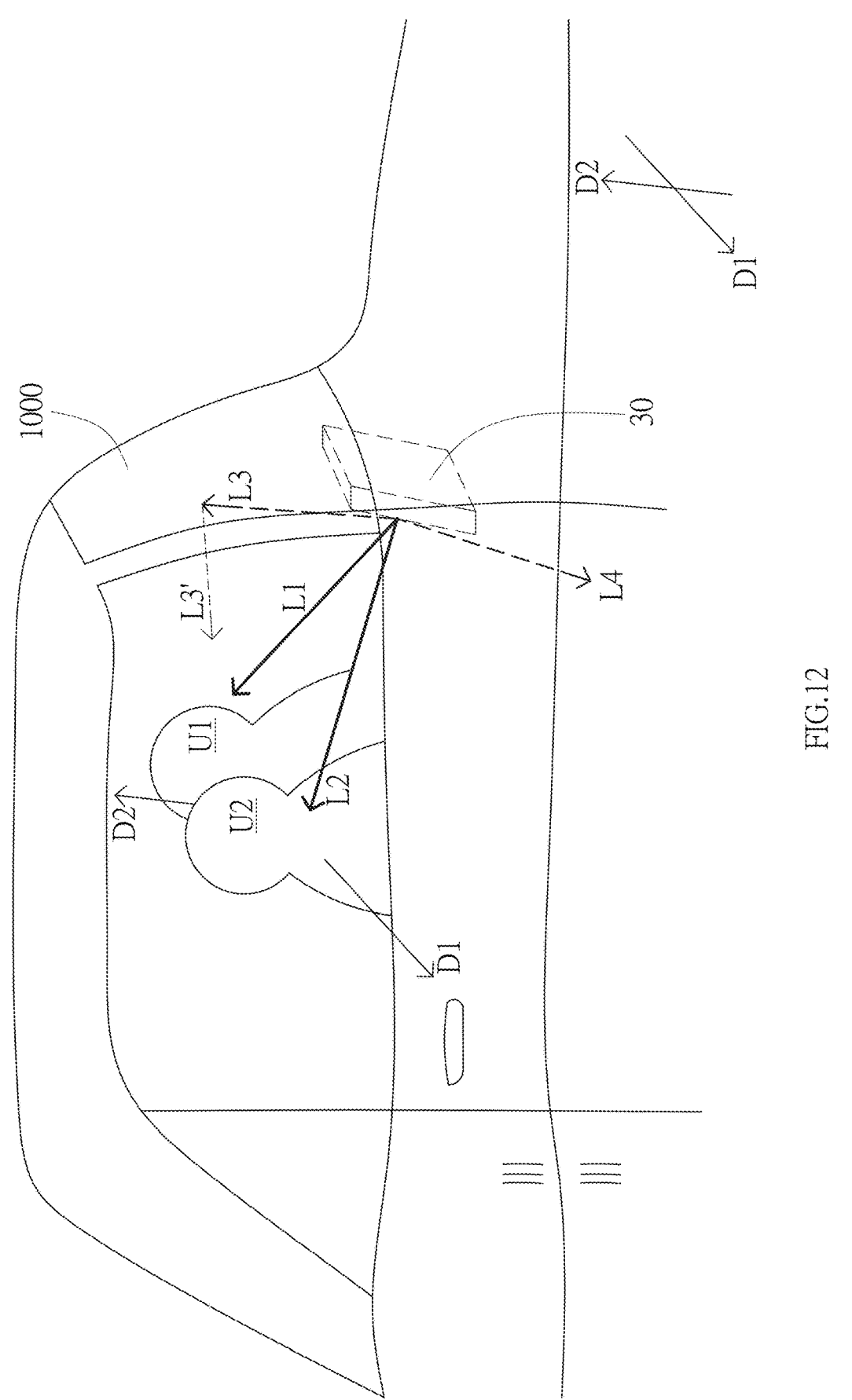
FIG. 12 is a schematic diagram of the display device applied as a vehicle display according to an embodiment of the present invention.
Figure 13:
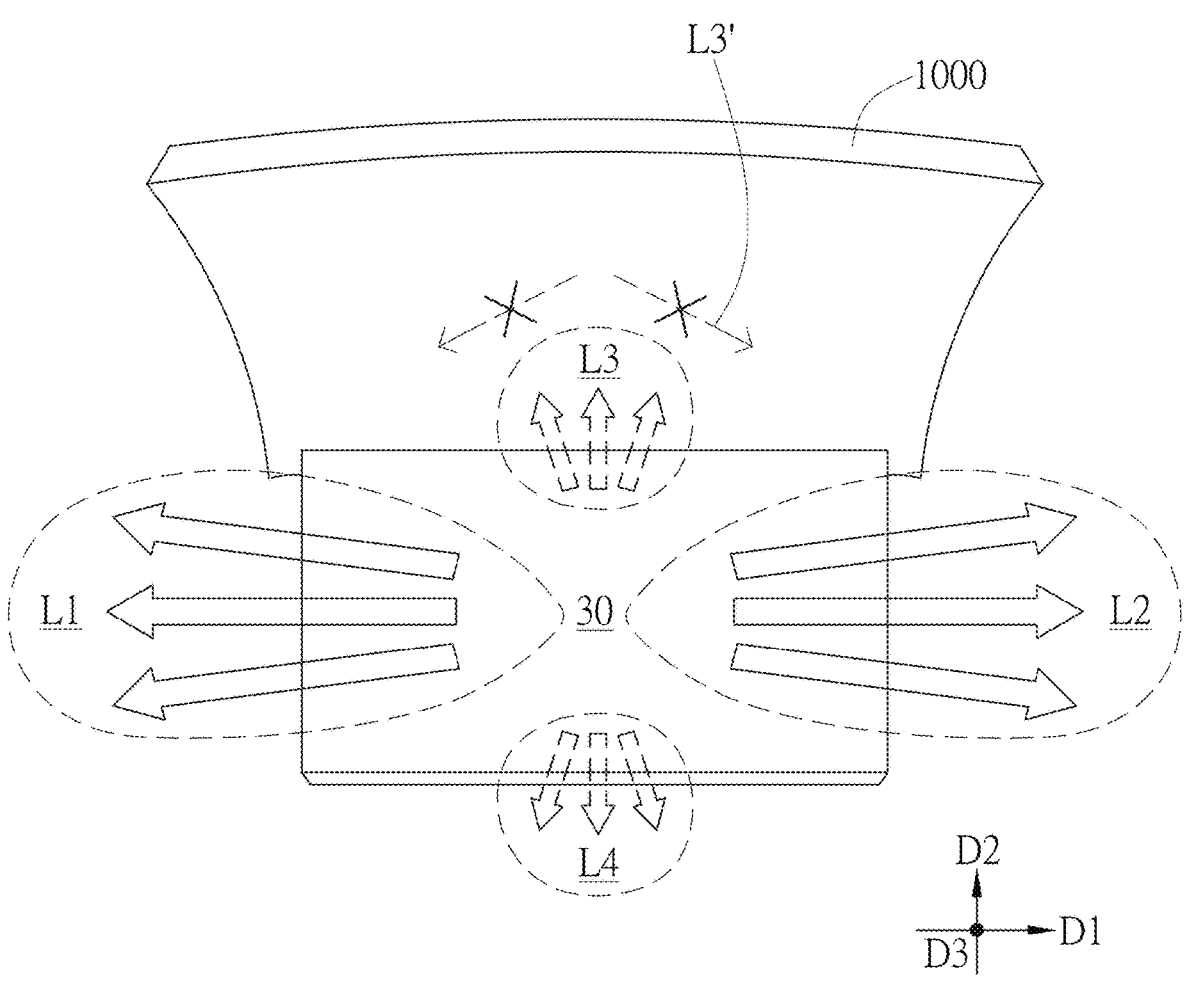
FIG. 13 is a schematic diagram of the display device with decreased light output or light reflection at unessential angles according to an embodiment of the present invention.

Furthermore, please refer to FIG. 12 and FIG. 13. The first metasurface and the second metasurface of the display device 30 may concentrate the light in other directions such as the second direction D2, so as to decrease or avoid the light L3 or L4 emitted toward unexpected directions, such as the second direction D2. As such, the possibility of the light L3 irradiating to the windshield 1000 of the vehicle and being reflected as the reflected light L3' can be decreased or avoided, for example. Specifically, the light field pattern of the display device 30 is concentrated and emitted for specific angles, so the light which irradiate to the windshield 1000 and is reflected to affect the driving vision can be decreased significantly. Therefore, according to the present embodiment, when the display device 30 having double metasurfaces and being capable of concentrating the light and splitting the light toward specific viewing angles (such as along the first direction D1) is operated, the display device 30 can further decrease or avoid the reflected light from the windshield 1000. As such, the interference of the light emitted in unessential angles or the interference of the light reflected by the windshield 1000 can be decreased or avoided. For example, the interference of the reflected light L3' can be decreased or avoided when the driver (e.g. the first recipient U1) observes the road condition through the windshield 1000.

As mentioned above, the display device 30 used as the vehicle display according to the present embodiment can improve the light output efficiency of the expected light, decrease the light loss of the unessential light, and further decrease or avoid possible line-of-sight interferences from the unexpected light and the reflected light thereof. Therefore, the display efficiency and the light utilization of the display device 30 can be enhanced to improve the viewing experience, and even further to facilitate the driving safety when using the vehicle display.

As mentioned above, the occasions or situations where the display device is applicable to perform the spectroscopic display according to the embodiments of the present invention are illustrated in FIG. 11 to FIG. 13. However, they are merely exemplarily, and the display device in the embodiments of the present invention can be used in other occasions or situations based on the characteristics of high directionality and high light utilization of the spectroscopic display. Therefore, the occasions or situations where the present invention can be applied are not limited to the specifically disclosed embodiments.

In summary, the display device according to the embodiments of the present invention can concentrate the light and split the concentrated light toward different viewing angles. Therefore, the light loss and light interferences of the unessential light can be decreased; the current efficiency and the light utilization can be effectively enhanced, and the display device of the embodiments of the present invention can be used in any occasions or situations where such a high directional display properties are needed.

The foregoing merely represents some preferred embodiments of the present invention. It will be apparent to people skilled in the art that various modifications and variations can be made to the disclosed embodiments without departing from the scope or spirit of the disclosure. It will be apparent to people skilled in the art that the present invention is defined by attached claims and without departing from the intention of the present invention, various variations such as replacement, combination, modification, and adapting for other purposes and the like do not exceed over the scope of the following claims of the present invention.

What is claimed is:

1. A display device, comprising:
a light source having a light emitting surface configured to emit light;
a light transmitting layer covering the light source, wherein the light transmitting layer has a light exit surface, and the light exit surface is configured to receive the light emitted from the light emitting surface;
a first metasurface formed between the light emitting surface and the light transmitting layer and configured to concentrate the light emitted from the light source along a first direction of the light emitting surface; and
a second metasurface formed on the light exit surface and configured to split, and concentrate toward different predetermined viewing angles, the light received by the light exit surface in the first direction,
wherein the second metasurface has a plurality of second microstructures, and the second microstructures are arranged along the first direction, and
wherein distances between cross sections of the second microstructures parallel to the light emitting surface have a distance change gradually increased from two ends to a center of the second metasurface along the first direction, and the second microstructures are arranged by repeating the distance change one or more times.

2. The display device of claim 1, wherein a plurality of sub-pixels are provided, and a plurality of the light sources are respectively and correspondingly included in the sub-pixels.

3. The display device of claim 1, wherein the light source is a micro light-emitting diode.

4. The display device of claim 1, wherein the first metasurface and the second metasurface are configured to concentrate the light in a second direction parallel to the light emitting surface and perpendicular to the first direction.

5. The display device of claim 1, wherein the first metasurface has a plurality of first microstructures.

6. The display device of claim 1, wherein cross sections of the second microstructures parallel to the light emitting surface have a shape with a short axis along the first direction and a long axis along a second direction parallel to the light emitting surface and perpendicular to the first direction.

7. The display device of claim 1, wherein the first metasurface has a plurality of first microstructures, and the first microstructures are circularly arranged parallel to the light emitting surface to form a plurality of rings.

8. The display device of claim 7, wherein cross sections of the first microstructures parallel to the light emitting surface have a size change gradually reduced from an outer ring toward an inner ring, and the first microstructures are arranged to form the plurality of rings by repeating the size change one or more times.

9. The display device of claim 8, wherein cross sections of the first microstructures in the innermost ring are the smallest.

10. The display device of claim 7, wherein distances between cross sections of the first microstructures parallel to the light emitting surface have a distance change gradually reduced from an outer ring toward an inner ring, and the first microstructures are arranged to form the plurality of rings by repeating the distance change one or more times.

11. The display device of claim 1, wherein cross sections of the second microstructures parallel to the light emitting surface have a size change gradually reduced from two ends to a center of the second metasurface along the first direction, the second microstructures are arranged by repeating the size change from the two ends to the center one or more times.

12. The display device of claim 11, wherein cross section of the innermost second microstructure closest to the center is the smallest.

13. The display device of claim 1, wherein the first metasurface has a plurality of first microstructures, and widths of cross sections of the first microstructures parallel to the light emitting surface range from 20 to 2000 nm.

14. The display device of claim 1, wherein widths of cross sections of the second microstructures parallel to the light emitting surface in the first direction range from 20 to 2000 nm, and lengths of cross sections of the second microstructures parallel to the light emitting surface in a second direction parallel to the light emitting surface and perpendicular to the first direction range from 20 to 4000 nm.

15. The display device of claim 14, wherein the widths of the cross sections of the adjacent second microstructures parallel to the light emitting surface in the first direction are different.

16. The display device of claim 1, wherein the first metasurface has a plurality of first microstructures, and distances between cross sections of the first microstructures parallel to the light emitting surface and distances between cross sections of the second microstructures parallel to the light emitting surface are smaller than 2000 nm, respectively.

17. The display device of claim 1, wherein the first metasurface has a plurality of first microstructures, and heights of the first microstructures and the second microstructures in a direction perpendicular to the light emitting surface are smaller than 2000 nm.

18. The display device of claim 1, wherein the first metasurface or the second metasurface is formed by a dielectric material, and a refractive index of the dielectric material for forming the first metasurface or the second metasurface is larger than a refractive index of the light transmitting layer.

* * * * *